United States Patent [19]
Liao et al.

[11] Patent Number: 5,479,047
[45] Date of Patent: Dec. 26, 1995

[54] SELF-ALIGNED BIPOLAR TRANSISTOR WITH VERY THIN DIELECTRIC LAYER INTERFACING BETWEEN POLY AND ACTIVE AREA

[75] Inventors: Kuan-Yang Liao, Laguna Niguel; Maw-Rong Chin, Huntington Beach, both of Calif.

[73] Assignee: Hughes Aircraft Company, Los Angeles, Calif.

[21] Appl. No.: 42,172

[22] Filed: Apr. 2, 1993

[51] Int. Cl.$^6$ .............................. H01L 29/73; H01L 29/70
[52] U.S. Cl. ........................... 257/592; 257/587; 257/588
[58] Field of Search .................................. 257/587, 588, 257/586, 592, 511, 591

[56] References Cited

U.S. PATENT DOCUMENTS

| | | | |
|---|---|---|---|
| 4,157,269 | 6/1979 | Ning et al. | 257/587 |
| 4,892,837 | 1/1990 | Kudo | 257/588 |
| 4,910,575 | 3/1990 | Komeda et al. | 257/588 |
| 5,148,252 | 9/1992 | Taka | 257/587 |
| 5,175,607 | 12/1992 | Ikeda | 257/511 |

OTHER PUBLICATIONS

"Self–Aligned Bipolar Transistor for High–Performance and Low–Power–Delay VLSI", IBM Research Report, Nov. 17, 1980, pp. 1–14.

*Primary Examiner*—Rolf Hille
*Assistant Examiner*—Wael M. Fahmy
*Attorney, Agent, or Firm*—Georgann S. Grunebach; Terje Gudmestad; W. K. Denson-Low

[57] ABSTRACT

A modification of the self-aligned double poly fabrication process for bipolar transistors employs a thin sacrificial dielectric film to protect the wafer surface during the etching of an emitter opening through an overlying polysilicon contact layer. The sacrificial layer, which is preferably silicon dioxide for a silicon wafer, is thick enough to serve as an etch stop but thin enough to permit dopant from the polysilicon contact to be driven-in through the film to form an extrinsic base region. The dielectric film is left in place under the base contact polysilicon, but removed from the emitter area. It is preferably about 10–20 Angstroms thick when implemented as a silicon dioxide film. With this material system, the extrinsic base drive-in is preferably performed either by a rapid isothermal anneal at about 1,000° C. for about 30–40 seconds, or in a furnace at about 975° C. for about 10 minutes.

5 Claims, 2 Drawing Sheets

SELF-ALIGNED BIPOLAR TRANSISTOR WITH VERY THIN DIELECTRIC LAYER INTERFACING BETWEEN POLY AND ACTIVE AREA

BACKGROUND OF THE INVENTION

1. Field of the Invention

This invention relates to the fabrication of self-aligned bipolar transistors, and more particularly to a transistor and associated fabrication process in which an extrinsic base is doped by thermally driving in dopant from an overlying doped contact.

2. Description of the Related Art

A standard process for fabricating high performance bipolar transistors, commonly referred to as the "self-aligned double poly" process, is described in Ning et al., "Self-Aligned Bipolar Transistors for High-Performance and Low-Power-Delay VLSI", *IBM Research Report*, Nov. 17, 1980, pages 1–14, which improves upon the prior method described in U.S. Pat. No. 4,157,269 to Ning et al. In this process the emitter region is self-aligned to a polysilicon ("poly") base contact, resulting in a small emitter-to-base contact separation and a low collector-to-emitter area ratio. With this process, however, the silicon wafer's surface tends to become damaged due to either an etch process used in the fabrication sequence, or to a sacrificial poly oxidation that is performed. The damaged or non-flat wafer surface reduces the reproducibility of the device's performance, and in some cases can degrade the chip yield.

SUMMARY OF THE INVENTION

The present invention seeks to provide a bipolar transistor and an associated fabrication process that retains the advantages of the self-aligned double poly process, but also protects the wafer surface in the emitter region.

This goal is accomplished by forming a thin dielectric film, preferably an oxide of the substrate material about 10–20 Angstroms thick, over an active area on a semiconductor substrate. With a silicon substrate, a doped poly contact layer is formed over the film, and that portion of the contact layer which is aligned with a base region of the active area is etched away. The film is then removed from over the base region, and dopant is driven-in from the overlying contact layer through the remaining film into an extrinsic base region located lateral to the base region. An intrinsic base dopant is then implanted into the base region, followed by the implantation of an emitter dopant into the intrinsic base and a collector dopant into the active area lateral to the extrinsic base. The device is completed with the formation of emitter, extrinsic base and collector contacts.

The thin dielectric film protects the surface of the base region as the overlying portion of the contact layer is etched. The contact layer can be etched all the way down to the dielectric film, with the film serving as an etch stop to protect the underlying semiconductor surface. Alternately, the contact layer etching can leave a thin residue of the contact layer material over the dielectric film in alignment with the base region, with the contact layer residue and the portion of the dielectric film over the base region thereafter removed in a common etch step.

The process is adaptable to the concurrent fabrication of complimentary bipolar transistors, and also to the fabrication of complimentary metal oxide semiconductor (CMOS) transistors on the same wafer.

These and other features and advantages of the invention will be apparent to those skilled in the art from the following detailed description, taken together with the accompanying drawings.

BRIEF DESCRIPTION THE DRAWINGS

FIGS. 1a–1h are sectional views showing successive stages in the fabrication of a bipolar transistor in accordance with the invention, with FIG. 1a showing the active areas for a pair of complimentary transistors and the remaining figures showing the transistor fabrication in one of the active areas.

DETAILED DESCRIPTION OF THE INVENTION

Figure 1A:
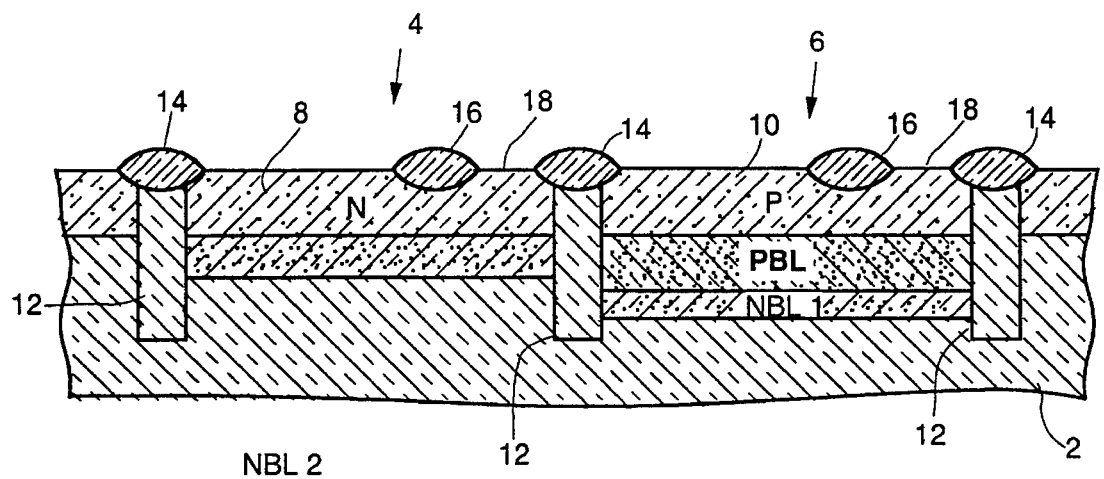

An early stage in the fabrication of a complimentary bipolar transistor circuit in accordance with the invention is shown in FIG. 1a. The invention is also applicable to the fabrication of non-complimentary transistors, and to the fabrication of bipolar transistors jointly with CMOS devices. The CMOS fabrication could be performed either before, after or at least partially simultaneously with the bipolar devices.

The circuit is fabricated on a semiconductor substrate 2, which in the illustration discussed herein is silicon but could also be another semiconductor material such as GaAs, InP, HgCdTe or some other Group III–V or II–VI semi-conductor compound. The devices to be fabricated in the illustration are a vertical npn bipolar transistor 4 and a vertical pnp bipolar transistor 6. To arrive at the early fabrication stage shown in FIG. 1a, the substrate is first masked and an n-doped buried layer NBL1 is implanted and driven-in to provide isolation for the vertical pnp device 6. Another n-doped buried layer NBL2 is then implanted through a second mask and driven-in for the collector of the npn device 4. Thermally driving in the NBL2 layer also drives the NBL1 layer deeper into the substrate. A p-doped buried layer PBL is then formed for the pnp device 6 by a p-dopant implant through a third mask, followed by a PBL drive-in.

In the next step, an n-doped epitaxial layer 8 is grown over the substrate to a thickness of about 1–3 microns, followed by an oxide layer about 500 Angstroms thick (not shown in FIG. 1a) over the epitaxial layer. A p-well 10 is then established in the pnp device area by a p-type implant through an appropriate mask, followed by a p-well drive-in.

Isolation trenches 12 are formed to isolate the two transistors from each other, and from the remainder of the wafer circuitry. Field oxide layers 14 are grown to a thickness of about 5,000 Angstroms over the isolation trenches, with additional field oxide layers 16 within the transistor areas to separate the collectors and bases. An active area for the npn device 4 is defined by the n-doped epitaxial layer 8 between adjacent isolation trenches 12, and an active area for the pnp device 6 is defined by the p-well 10 between its isolation trenches. The oxide layer is stripped from most of the transistor active areas, leaving the field oxide layers 14 and 16 and relatively thick (about 500–1,000 Angstroms) oxide layers 18 over the transistor collector areas.

Figure 1B:
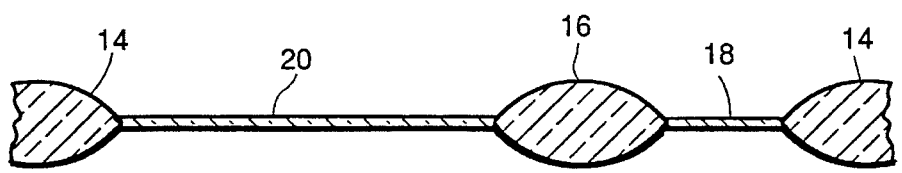

Up to this point the fabrication process is not new. However, a departure is taken from the conventional process with the next step, illustrated in FIG. 1b. This figure and the succeeding figures show the further development of the npn device 4 from FIG. 1a; the fabrication of the pnp device 6 is done concurrently with essentially the same process, but with the dopant polarities reversed. In FIG. 1b a thin sacrificial dielectric layer 20 is grown over the active area. With a silicon substrate, the dielectric layer 20 can be growl by thermal oxidation with an ASM (Advanced Semiconductor Materials International N.V.)—600 series oxidizing system, at a temperature of 600° C.

The sacrificial dielectric layer 20 plays a critical role in the invention, protecting the underlying substrate during a subsequent poly etch. The sacrificial layer must satisfy three general characteristics: (1) it must be thin enough to be broken through during a subsequent drive-in of dopant from an overlying poly layer into the active area; (2) it must be thick enough and of suitable composition to function as an etch stop during the subsequent etching of a portion of the overlying poly; and (3) it must be capable of being grown with no pin holes or other defects through which an etchant can travel to attack the underlying surface of the active area.

With a silicon substrate, silicon dioxide about 10–20 Angstroms thick is the only oxide presently known that is suitable for the sacrificial layer; other oxides are too resistant to a breakthrough of dopant from an overlying poly layer when the substrate is heated. $TiO_2$ and $Si_3N_4$ are other candidates for the sacrificial dielectric layer. Although the latter two materials cannot be thermally grown on silicon, they can be deposited as thin films by chemical vapor deposition (CVD) or sputtering. Although it would be difficult to form suitable sacrificial layers for material systems other than silicon with current technology, future developments may make it easier to adapt the invention to non-silicon circuits. For the Group III–V materials, silicon dioxide, gallium oxide and arsenic oxide are potential sacrificial layer materials for GaAs, while indium oxide is a potential sacrificial layer material for InP. For the Group II–VI materials, an oxide of InHgCdTe is a suitable candidate for the sacrificial layer with a HgCdTe substrate.

Figure 1C:
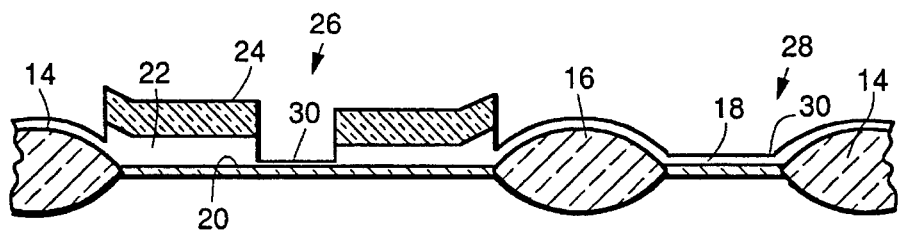

Referring now to FIG. 1c, an in-situ deposition of a poly layer 22 is made over the sacrificial oxide layer 20 to a thickness of about 1,500–3,000 Angstroms, preferably by low pressure CVD. The poly is then implanted with a p-type dopant such as boron (or an n-type dopant such as arsenic or phosphorous for a pnp device), to a concentration of about $5\times10^{20}cm^{-3}$. An oxidation blocking mask 24 from a material such as silicon nitride is next deposited over the poly layer 22, to a thickness of about 2,000 Angstroms. A layer of photoresist (not shown) is then deposited over the silicon nitride laver 24 and patterned to establish emitter and collector areas for the transistor, followed by etching away the silicon nitride and poly through the patterned photoresist to open up emitter and collector areas 26 and 28, respectively.

In the ideal situation, the poly in the emitter and collector areas is etched all the way down to the thin oxide film 20, which acts as an etch stop. However, if the etchant's selectivity of poly over the oxide film is not high enough to ensure that the etch will be completely stopped before it reaches the underlying silicon, the etch can be stopped slightly above the oxide film by standard end point detection techniques. This leaves a slight residue 30 of poly in both the emitter and base areas. The oxide film still serves the important function of protecting the silicon surface against any unintended over-etching of the poly beyond the desired end point detection level.

Figure 1D:
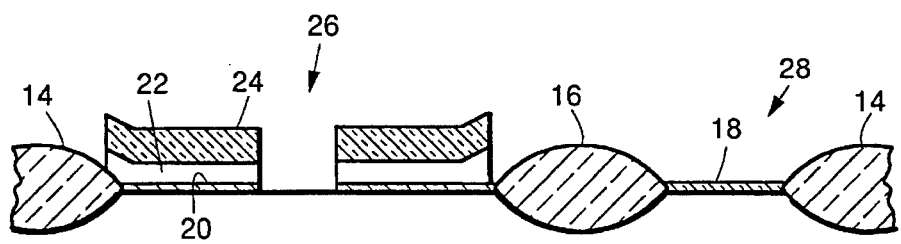

Assuming that a poly residue 30 has been left, the wafer is next dipped in a buffer oxide etch solution and then wet etched in a KOH solution to remove any thin oxide layer that may have fallen on the poly residue. These steps are not needed if the initial etch has been performed all the way down to the oxide film 20. The wafer is next dipped in a buffer oxide etch solution to strip away the oxide film in the emitter area (along with any remaining poly residue), and to thin the oxide layer 18 over the collector area somewhat. Unlike the poly etch, an oxide etch is not harmful to the underlying active area silicon surface. The resultant structure is shown in FIG. 1d, with the emitter area exposed down to the surface of the silicon and the thinned oxide layer 18 over the collector area. The exposed silicon surface is flat and substantially defect free, since it was protected during the poly etching process by the thin oxide film that was later removed from this area.

Figure 1E:
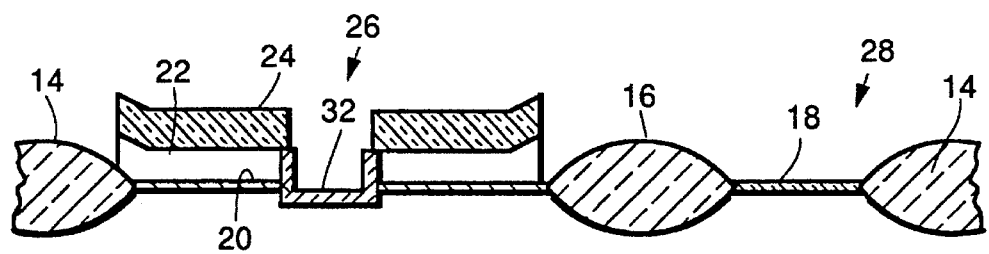

In the next step, the exposed silicon and poly are oxidized to a depth of approximately 1,000 Angstroms. This forms a $SiO_2$ coating 32 in the emitter area, and adds somewhat to the thickness of the oxide 18 over the collector area (FIG. 1e).

Figure 1F:
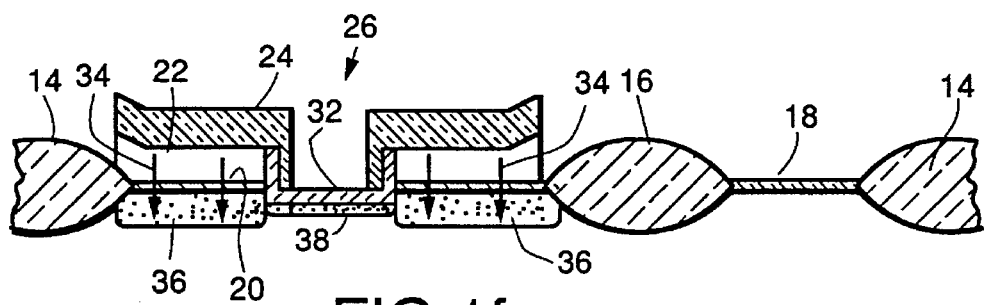

An extrinsic base region is now formed as illustrated in FIG. 1f by driving-in dopant from the remaining poly layer 22, which is protected by the silicon nitride 24, through the underlying thin oxide film 20 and into the silicon below the oxide film. The approximately 10–20 Angstrom thickness of the oxide film is thin enough to allow the poly dopant to penetrate directly through the film under proper drive-in conditions. The drive-in is preferably performed by either rapid isothermal anneal at a temperature of about 1,000° C. for about 30–40 seconds, or in a furnace at a temperature of about 975° C. for about 10 minutes. The dopant drive-in, indicated by arrows 34, forms a p-type doped extrinsic base region 36 in the silicon below the oxide film 20.

At this point the novel aspect of the transistor fabrication has been accomplished, and the device can be completed with a conventional process. This involves the implantation of a p-type intrinsic base region 38 into the silicon through the emitter opening 26, the deposition of an additional silicon nitride layer about 2,000 Angstroms thick over the entire substrate, and a blank etching of the additional silicon nitride to form a spacer layer 40 around the side walls of the emitter opening 26. The spacer layer protects the side, walls of the emitter oxide layer 32 from subsequent etching.

Figure 1G:
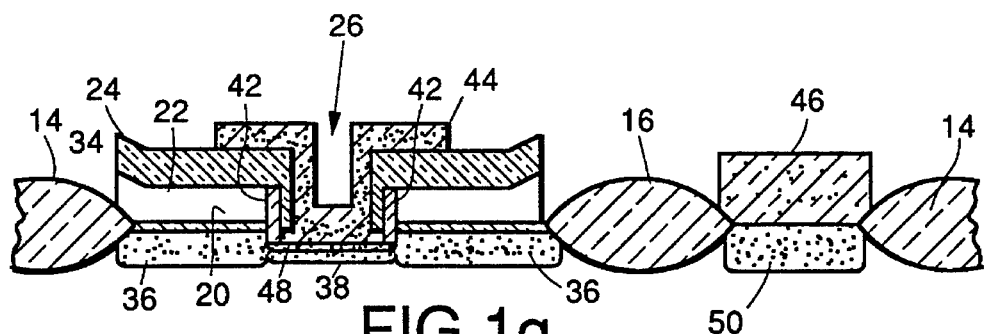

A later stage in the transistor fabrication is shown in FIG. 1g. To reach this stage, the emitter oxide 32 is wet etched with an isotropic etchant to remove the portion of the emitter oxide 32 that contacts the underlying silicon, leaving only the oxide side walls 42. A layer of emitter contact poly 44 is next deposited over the substrate and into the opening 26, and implanted to a desired emitter contact dopant concentration (preferably about $5\times10^{20}cm^{-3}$). The emitter poly is then patterned and etched, leaving only the emitter contact poly 44 shown in FIG. 1g, followed by stripping away the patterning photoresist.

Etching away the emitter oxide 32 also removes the collector oxide 18, and the poly layer 44 that forms the emitter contact also establishes a collector contact poly layer 46. A "home-in" drive is then performed to anneal the emitter and collector poly layers 44 and 46, and to drive-in the n-type emitter poly dopant about 500 Angstroms to form an emitter 48 at the upper end of the intrinsic base 38. At the same time, n-type dopant from the collector poly 46 is driven-in to form a collector region 50 in the silicon. The "home-in" drive is a conventional step, and can be performed by either a rapid isothermal anneal at a temperature of about 1,000° C. for about 10 seconds, or in a furnace at a temperature of about 880° C. for about 15 minutes.

Figure 1H:
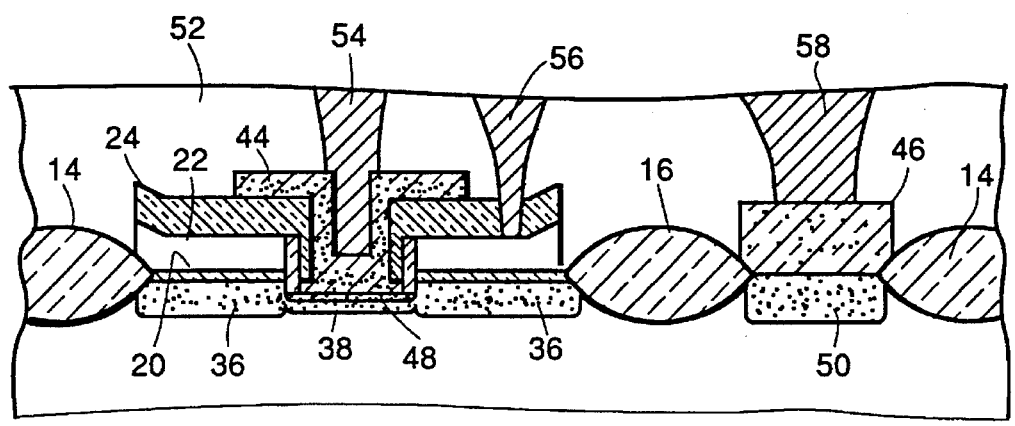

The completed transistor is shown in FIG. 1h. To reach this stage, an oxide layer 52 is deposited over the structure shown in FIG. 1g. The oxide layer 52 (along with the underlying silicon nitride layer 24) is patterned with a photoresist layer (not shown) and etched to form contact openings, which are filled with a metallization deposition to establish emitter, base and collector contacts 54, 56 and 58, respectively. The photoresist is then stripped off to leave the finish transistor. The emitter contact is made through metal deposit 54 and emitter poly 44, the base contact is made through metal deposit 56 and base poly 22 and the collector contact is made through metal deposit 58 and collector poly 46.

The provision of the thin sacrificial dielectric film 20 eliminates the difficult problem of damage to the silicon surface during the formation of the emitter opening. The invention accomplishes this with readily available equipment and a method that is easy to integrate into the standard process, and yet results in more reproducible devices. The chip yield can be significantly improved, with the enhanced single crystalline surface at the emitter junction resulting in an improved $BV_{ebo}$ (emitter-base junction breakdown voltage) and better $V_{be}$ (forward base-emitter voltage) and $\beta$ (current gain) matchings between devices; these are highly important criteria for analog applications.

While a particular illustrative embodiment of the invention has been shown and described, numerous variations and alternate embodiments will occur to those skilled in the art. Accordingly, it is intended that the invention be limited only in terms of the appended claims.

We claim:

1. A bipolar transistor structure, comprising:

a semiconductor substrate having an active area;

a doped emitter having outer edges and a doped collector in said active area;

a doped intrinsic base below said emitter;

a doped extrinsic base lateral to said intrinsic base;

an emitter contact contacting a portion of the upper surface of said emitter that is spaced inward from the emitter's outer edges;

dielectric walls extending upward from said emitter lateral to said emitter contact, said dielectric walls having outer surfaces vertically aligned with the emitter's outer edges;

a doped contact layer over said extrinsic base, said doped contact layer extending to said dielectric walls on either side of the emitter and having inner edges vertically aligned with the emitter's outer edges;

a thin dielectric film about 10–20 Angstroms thick between said extrinsic base and said contact layer, said dielectric film extending to said dielectric walls on either side of the emitter and having inner edges vertically aligned with the emitter's outer edges; and collector and extrinsic base contacts.

2. The bipolar transistor structure of claim 1, wherein said dielectric film comprises an oxide of the substrate material.

3. A bipolar transistor structure, comprising:

a semiconductor substrate having an active area;

a doped emitter and a doped collector in said active area;

a doped intrinsic base below said emitter;

a doped extrinsic base lateral to said intrinsic base;

a doped contact layer over said extrinsic base;

a dielectric film about 10–20 Angstroms thick between said extrinsic base and said doped contact layer; and emitter, collector and extrinsic base contacts.

4. The bipolar transistor structure of claim 3, wherein said dielectric film comprises an oxide of the substrate material.

5. The bipolar transistor structure of claim 3, further comprising a complementary bipolar transistor on the same substrate with a similar structure to said first transistor but with dopings that are complementary to the first transistor dopings.

* * * * *